United States Patent [19]
Bourassa

[11] Patent Number: 4,658,378
[45] Date of Patent: Apr. 14, 1987

[54] POLYSILICON RESISTOR WITH LOW THERMAL ACTIVATION ENERGY

[75] Inventor: Ronald R. Bourassa, Colorado Springs, Colo.

[73] Assignee: Inmos Corporation, Colorado Springs, Colo.

[21] Appl. No.: 449,984

[22] Filed: Dec. 15, 1982

[51] Int. Cl.$^4$ .................. H01L 29/04; H01L 29/86
[52] U.S. Cl. ................................ 365/154; 357/51; 357/59
[58] Field of Search ................. 357/51, 59; 365/154

[56] References Cited

U.S. PATENT DOCUMENTS

| | | | |
|---|---|---|---|
| 3,248,677 | 4/1966 | Hunter et al. | 357/63 |
| 3,683,306 | 8/1972 | Bulthuis et al. | 357/63 |
| 3,943,545 | 3/1976 | Kim | 357/59 |
| 4,041,522 | 8/1977 | Oguey et al. | 357/42 |
| 4,297,721 | 10/1981 | McKenny et al. | 357/59 |
| 4,377,819 | 3/1983 | Sakai et al. | 357/59 |

OTHER PUBLICATIONS

Manoliu et al., "P-N Junctions in Polycrystalline-Silicon Films" *Solid-State Electronics*, 1972, vol. 15, pp. 1103–1106.
Dutoit et al., "Lateral Polysilicon P-N Diodes" *J. Electrochem Soc.* (Oct. 1978), pp. 1648–1651.
DeGraaf et al., "Grain Boundary States and the Characteristics of Lateral Polysilicon Diodes", *Solid State Electronics* (1982), pp. 67–71.
Taubenest et al., "*Polycrystalline Silicon Integrated Thin Film Resistors* (1973), Centre Electronique Horloger S.A.).
Korsh et al., "Conduction Properties of Lightly Doped, Polycrystalline Silicon" *Solid State Electronics* (1978), pp. 1045–1051.
Seto, "The Electrical Properties of Polycrystalline Silicon Films," *J. App. Phys.* (1975), pp. 5247–5254.
Lu, et al., "A Quantitative Model of the Effect of Grain Size on the Resistivity of Polycrystalline Silicon Resistors," *IEEE Electron Dev. Ltrs.* (1980), pp. 38–41.
Lu, et al., "A New Conduction Model for Polycrystalline Silicon Films", *IEEE Electron Dev. Ltrs.* (1981), pp. 95–98.
Lu, et al., "Modeling and Optimization of Monolithic Polycrystalline Silicon Resistors", *IEEE Electron Dev. Ltrs.* (1981), pp. 818–830.
Tsuchimoto et al., "Ion Implantation of Impurities into Polycrystalline Silicon", *Ion Implantation in Semiconductors*, S. Namba, ed., pp. 605–612, (Plenum Publishing Corp. 1975).

*Primary Examiner*—William D. Larkins
*Attorney, Agent, or Firm*—Edward D. Manzo

[57] ABSTRACT

An improved load resistor for a VLSI memory cell is formed in polysilicon by having P-type (such as boron) impurities in a middle region and n-type (such as phosphorous or arsenic) impurities on the sides, with the concentrations being in a range so that the thermal activation energy is below about 0.5 eV. Further, the middle region can be doped additionally with arsenic or phosphorous in an amount equal to or less than the boron. This gives good leakage current masking over a range of −55° to +125° C. without drawing excessive current, and is less sensitive to impurities.

15 Claims, 5 Drawing Figures

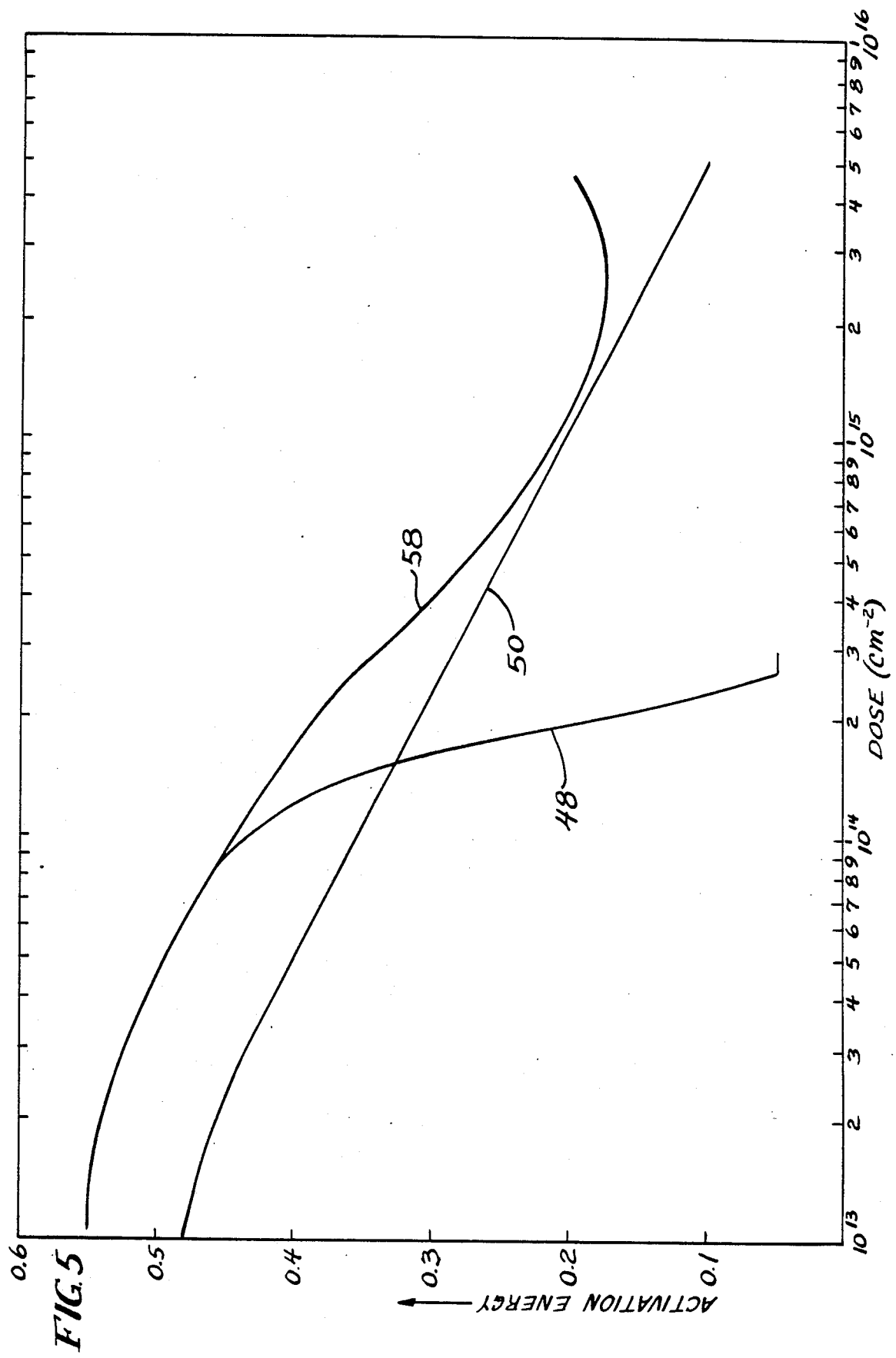

POLYSILICON RESISTOR WITH LOW THERMAL ACTIVATION ENERGY

BACKGROUND OF THE INVENTION

The present invention relates to semiconductor resistors of the type typically used in random access memories.

A static RAM cell includes a flip-flop and two load resistors. Each resistor is coupled to a voltage source at one side, and the other side is coupled to the gate of one of the FET transistors forming the flip-flop. It is also connected to the source of the other FET whose drain is connected typically to ground. Typically, the resistance range in static RAMS has been on the order of 50 gigaohms. However, this resistance is too high for VLSI such as 16k static RAMS. The problem is that with a high resistance, as the memory cells get smaller in size, the leakage increases. If the transistor leaks, current is drawn from the power supply and results in a voltage drop across the resistor. If the voltage drop is too high, the flip-flop can change state. Therefore, it is desirable to use a lower resistance to minimize the possibility of the flip-flop in a memory cell changing state spuriously, thereby causing a potentially disastrous result of changing the stored data. Thus, the lower resistance masks more leakage current than a higher resistance, and is therefore desirable.

On the other hand, if the resistance is lowered too much, the memory cell draws too much power and can lead to malfunctioning. There is a maximum current which should be respected for a memory device. For example, for a 16k RAM, a single memory cell should have an upper limit of its current draw at about 1.2 microamps.

FIG. 1 is a sketch which illustrates the curve of resistance versus impurity dose for a normal polysilicon doped resistor. As can be seen, this curve includes a major portion where as the dose increases, the resistance climbs slowly along a slightly inclined plateau. In this part of the curve, the resistance is not very sensitive to dosage variations. The general resistance range of that major portion of the curve is too high for VLSI load resistors. Lower resistances occur in the minor portion of the curve, which has a very large change in resistance with respect to the change in dosage. A portion 10 shows the preferred resistance range for VLSI memory cell resistors.

In the past, the art has suffered the high resistance and consequent large voltage drop and low masking ability. Alternatively, the prior art has lowered the resistance by increasing the implant of N dopant such as phosphorus which pushes the resistor over the transition point shown in FIG. 1. However, many problems are still found to exist with the resistance lowered in this fashion.

When passivation occurs to fill in holes and seal off the part by an oxide such as silox or a nitride, the resistance can decrease by a factor of 100. Mere packaging has resulted in a change by a factor of hundreds or even as much as a factor of 2000. These changes are not regular, and prior to the present invention, were a substantial problem. Another problem is that at high temperatures, the resistance drops so low that too much current is drawn.

Therefore, the main object of the present invention is to provide a suitable resistor for use in a VLSI memory cell which can provide good leakage over a wide temperature range.

Further objects are to provide a resistor which does not have as steep a curve of resistance versus dosage in the desired working area, and to provide a structure which is less sensitive to impurities.

BRIEF DESCRIPTION OF THE DRAWINGS

FIG. 5 is a graph showing the activation energy of various resistors plotted against dosage (in logarithmic scale).

SUMMARY OF THE INVENTION

A resistor is formed in polysilicon by having P-type (such as boron) impurities in a middle region and n-type (such as phosphorous or arsenic) impurities on the side, with the concentrations being in a range so that the thermal activation energy is below about 0.5 eV. Further, the middle region can be doped additionally with arsenic or phosphorous in an amount equal to or less than the boron. Thus, a P-type middle region is flanked by n-type regions. This can be reversed, so that an n-type middle region can be flanked by P-type regions.

DESCRIPTION OF A PREFERRED EMBODIMENT

Figure 2:
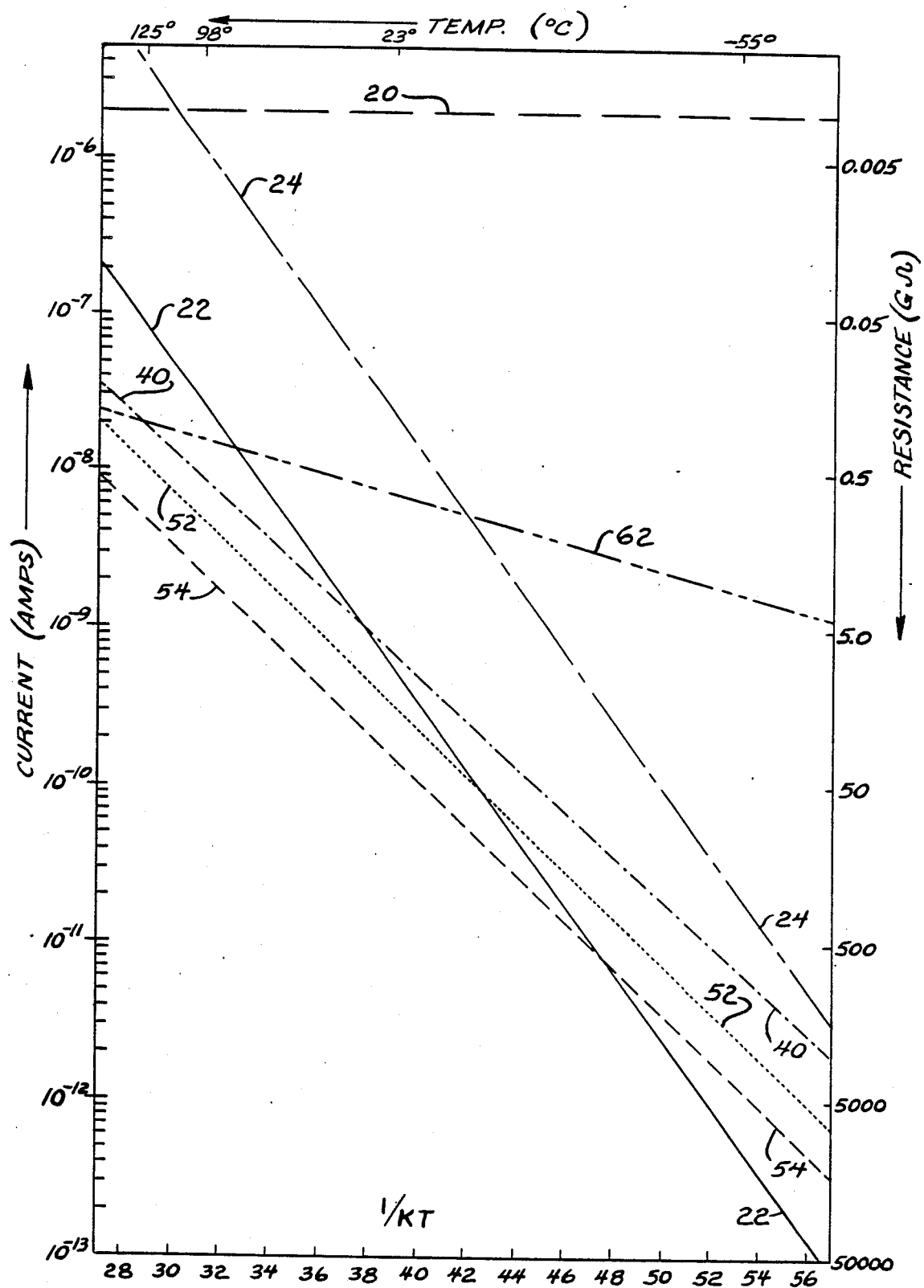
FIG. 2 is a graph using logarithmic increments in the Y dimension showing the current at 5 volts against temperature (°C.); for various prior art and invented resistors.

FIG. 2 is a graph showing the characteristics of the standard polysilicon resistor as well as other semiconductor devices against various parameters. The abscissa of this graph is related to temperature whereas the ordinate, which is in logarithmic form having seven decades, represents the resistance of the device or, correspondingly, the current at 5 volts. On FIG. 2, a curve 20 represents the maximum current permitted to any single memory cell at 5 volts. In the case of a 16k RAM, the maximum current of 1.2 microamps is typical which corresponds to a maximum circuit current of 20 milliamps, and curve 20 is representative thereof.

Curve 22 represents a normal polysilicon resistor. It will be seen that within the normal test temperature range of 125° C. to −55° C., the current drawn by the resistor stays within the permissible bounds. However, the current at very low temperatures, representative of the maskable leakage current, is exceedingly low. At a temperature of −55° C., the maskable current at 5 volts is merely about $6 \times 10^{-13}$ amperes.

However, if the standard polysilicon resistor is passivated with a nitride, curve 24 has been found to result. As will be seen, curve 24 crosses the maximum current barrier line 20 at a temperature of 80° C. to 90° C. This is plainly unacceptable. Another problem with normal polysilicon resistors is evident from FIG. 2, namely, the wide variation of resistance with temperature change.

It has been found, in connection with this invention, that the resistance varies generally in accordance with an exponential curve defined by the following equation (1)

$$R = R_o e^{Ea/kT} \quad (1)$$

where $R_o$ is some constant, Ea is the thermal activation energy, k is Boltzmann's constant and T is temperature. The activation energy is related to the temperature coefficient of resistance $T_c$ by the following equation (2)

$$T_c = (1/R)(dR/dT) = -Ea/kT^2 \quad (2)$$

It will be understood that these equations are for a simplified model of temperature dependence of resistance.

Measurement for a normal polysilicon resistor shows that the thermal activation energy Ea is approximately 0.5 electron volts (eV) when the resistance is in the range used for load resistors, 0.1 to 50 gigaohms. When the thermal activation energy is decreased below 0.5 eV for prior art polysilicon resistors, the resistance falls below the useful range.

Figure 1:
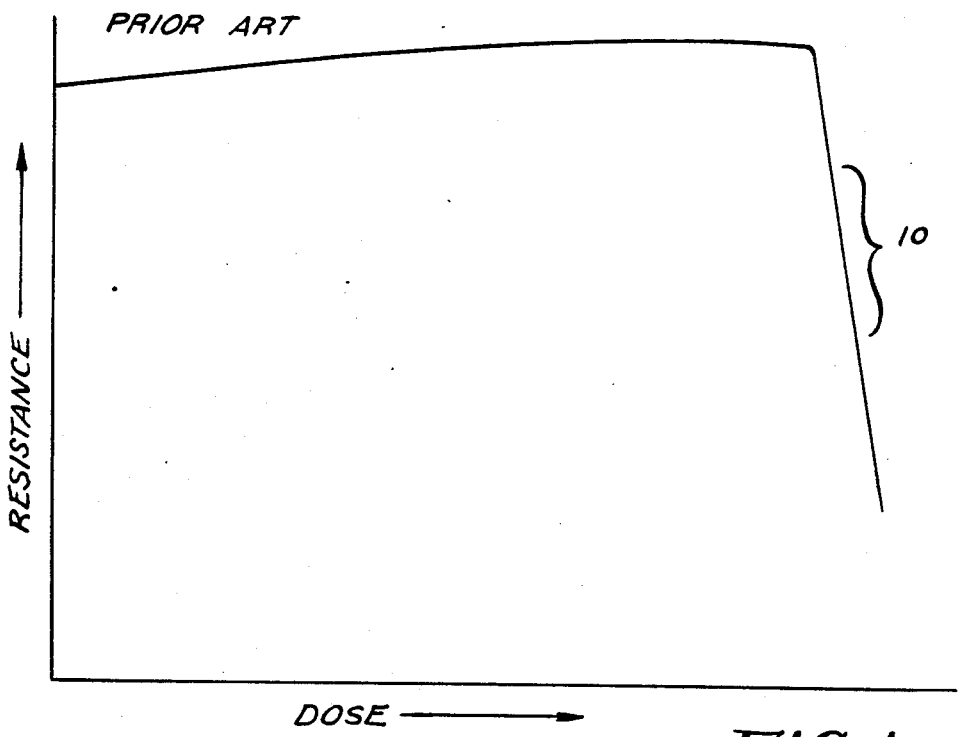
FIG. 1 is a sketch showing a curve of resistance against implant dose for prior art polysilicon resistors.
Figure 3:
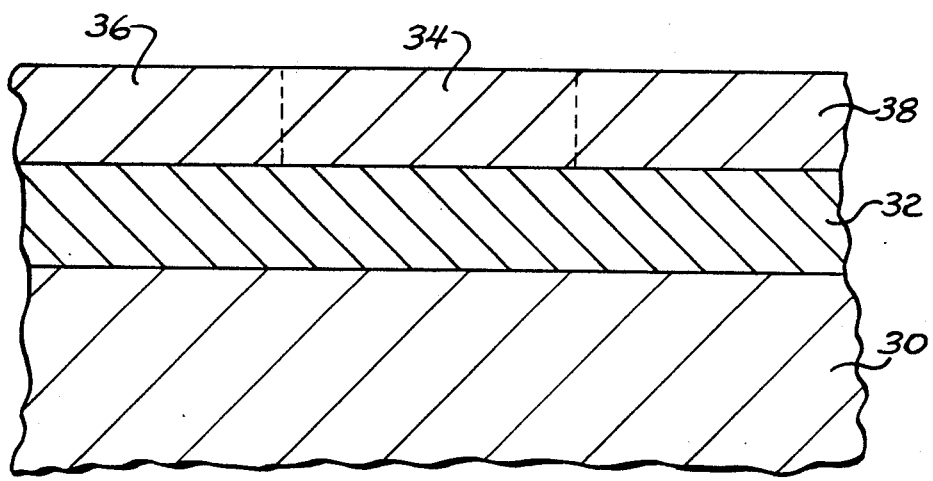
FIG. 3 is a sectional representation showing a resistor according to the present invention formed above the silicon substrate and field oxide.

FIG. 3 is a representative sectional view of a resistor according to the present invention on a single crystal silicon substrate 30 covered by a layer of field oxide 32. Above this layer is a region 34 flanked by N+ regions 36 and 38. In the prior art, the polysilicon is generally all doped with an n-type substance. Region 34 would have a different concentration of the dopant or would have the dopant in a restricted area, thereby to result in a resistance. The invented resistor has, illustratively, a rectangular shape in a plan view (not shown).

Figure 4:
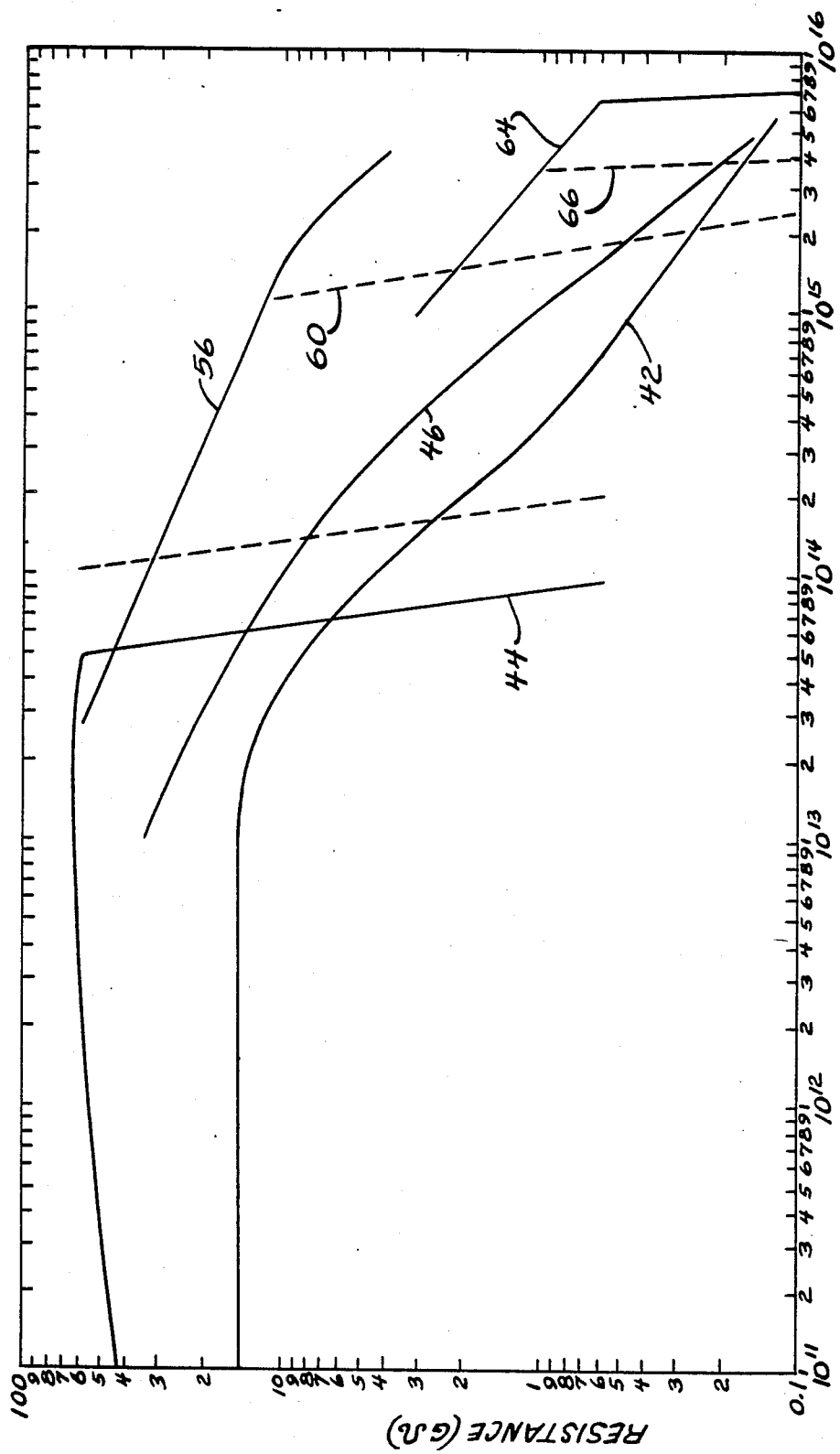
FIG. 4 is a graph using logarithmic increments in the X and Y dimensions showing the resistance against implant dose for prior art and invented resistors.

According to a first example of the present invention, region 34 instead is doped with a P-type material such as boron. The properties of the resulting resistor are shown in FIGS. 2, 4 and 5. In FIG. 2, the measured resistance and maskable current of the boron resistor are shown as a curve 40. It will be seen that curve 40 is entirely below the maximum current barrier 20, and that the boron resistor provides good maskable current over the temperature test range. The boron concentration used to determine curve 40 is $4 \times 10^{18}$ per cubic centimeter.

FIG. 4 is a graph of resistance versus implant dose in a log-log format, and shows the resulting curves for various devices. The dose is with respect to a 5000 Angstrom thick polysilicon layer ($0.5 \times 10^{-4}$ cm). The ideal resistance curve of a load resistor for VLSI memory cell is shown as curve 42. The measured normal polysilicon resistor is shown as curve 44. The resistance curve with respect to dosage of the boron resistor is shown as curve 46. It will be observed that the resistance of the boron resistor does not have as steep a curve in the range of interest (0.1-50 gigaohms) as the standard resistor.

FIG. 5 is a graph on logarithmic X-scale of thermal activation energy versus dose for various devices. The thermal activation energy for normal resistors is shown by curve 48. The curve for the boron resistor is curve 50, and, as can be observed, curve 50 is generally linear and not nearly as steep as curve 48 for standard polysilicon resistors.

According to various features of the present invention, regions 34, 36 and 38 can have various concentrations of boron, phosphorous or arsenic. This results in a resistor whose current resistance behavior is less sensitive to impurities by a factor of 25 than the normal polysilicon resistor value in the desired resistor range. The thermal activation energy is lower than 0.5 eV, and can be as low as 0.1 eV. Lower activation energy results in a lower slope in the curves of FIG. 2.

In a second example, region 34 of FIG. 3 contains a compensating dopant, i.e. where the dopant is P-type, the compensating dopant is n-type. Thus, in a nearly compensated device, region 34 contains boron (P-type) and nearly as much n-type dopant such as a pentavalent element such as phosphorous or arsenic dopant. Thus, in the second example the boron dose can exceed $10^{14}$ per square centimeter (a concentration of $2 \times 10^{18}$), with a phosphorous doping also in region 34 at a concentration somewhat less than the concentration of boron. This may be called a phosphorous nearly compensated (NCD) resistor and its characteristics are shown in FIGS. 2, 4 and 5. In FIG. 2, the resistance or maskable current is shown with respect to temperature. Curve 52 ilustrates the characteristics of the NCD resistor. As will be seen, its characteristics with respect to maskable current versus temperature are very close to the characteristics of the boron resistor, illustrated as curve 40. The NCD resistor when covered with nitride in passivation results in a curve 54. As can be seen, the NCD resistor curves 52 and 54 stay well under the maximum current limitations defined by curve 20 of FIG. 2, while still permitting acceptable maskable current over the full temperature test range. FIG. 4 shows the resistance versus dose characteristics of these NCD resistors. The phosphorous nearly compensated diode has the characteristics shown by curve 56. FIG. 5 shows the thermal activation energy with respect to dose of the NCD resistors as curve 58.

In a third example, the region 34 can be boron doped (P-type) together with an equal doping of phosphorous. A characteristic of the resulting device is shown in FIG. 4 as a curve 60, which is colinear with curve 56 below a dosage of approximately $10^{15}$, but which thereafter displays a fairly steep rate of change of resistance.

In a fourth example, the boron doped region 34 may also be doped with arsenic (As) in a concentration less than that of the boron. Typically the boron concentration exceeds $2.0 \times 10^{18}$ per cubic centimeter (dose greater than $10^{14}$ per square cm.) The characteristics of the resulting device are shown in the figures. FIG. 2 contains a curve 62 for the arsenic NCD resistor at a concentration of $10^{-20}$ cm$^{-3}$ boron and $2 \times 10^{-19}$ cm$^{-3}$ arsenic. As will be seen from curve 62, this combination shows excellent ability to mask leakage current and is fairly stable with respect to temperature. As shown in FIG. 4, curve 64 shows the resistance dosage of this semiconductor device where the concentration of boron exceeds the concentration of arsenic.

In a fifth example, the concentration of arsenic in region 34 can be equal to the concentration of boron. The resistance versus dose characteristic of this device is shown as curve 66 in FIG. 4.

In these examples, regions 36 and 38 are doped with an n-type material such as either arsenic or phosphorous. Even if the dopant in region 34 is phosphorous, regions 36 and 38 may be doped with arsenic, if desired. If desired, regions 34, 36 and 38 can all contain arsenic doping, while the region 34 contains the boron doping. Alternatively, regions 34, 36 and 38 may all be doped with phosphorous, while the region 34 may contain boron doping. Other P-type or n-type dopants can be used within the scope of the present invention.

To make a device according to the present invention, various methods can be used, as follows. In a first method, an insulating layer such as field oxide 32 (FIG.

3) can be deposited or grown over the single crystal silicon substrate 30. Then polysilicon can be deposited over the insulating layer. The polysilicon can be doped uniformly with an n-type dopant at a concentration up to about $10^{20}$ per cubic centimeter. Next, the polysilicon can be doped uniformly with a P-type dopant of equal or greater concentration. This P-type dopant should have a concentration not less than $10^{18}$ per cubic centimeter in order to achieve low thermal activation energies. The next step is to mask the resistor area and then dope the unmasked portion of the polysilicon with an n-type dopant at a concentration greater than the P-type dopant used in the prior step. Last, the poly lines can be etched as desired. One advantage of this method is that no extra mask is needed. The disadvantages are that circuit sensitivity to high implants may limit concentrations in the first n-type doping and the P-type doping to less than $10^{19}$ per cubic centimeter, thereby limiting the activation energy values to greater than 0.25 eV.

A second method of making a device according to the present invention begins with the same two steps, that is, depositing or growing an insulating layer over the single crystal silicon substrate and then depositing polysilicon over the insulating layer. Third, the resistor area should be masked, and the remaining polysilicon should be doped with the n-type dopant at a concentration of up to about $10^{21}$ per cubic centimeter. The fourth step is to mask all of the poly except the resistor area, and dope the resistor area with an n-type impurity at a concentration of up to about $10^{20}$ per cubic centimeter. Fifth, leaving the mask on, the resistor area is doped again but with a P-type impurity at a concentration of between $10^{18}$ and $10^{20}$ per cubic centimeter, but greater than or equal to the concentration of the n-type dopant with which the resistor area had been doped in the fourth step. Finally, the sixth step is to etch the poly lines as desired. Advantages of this second method are that the P-type dopant enters only the resistor areas and therefore does not affect other circuit parameters. High concentrations can be obtained so that the thermal activation energy Ea can be reduced to as little as 0.1 eV. The apparent disadvantage of this method is that it uses an extra mask step.

A third method for fabricating a device according to the present invention begins, as before, with the first two steps of depositing or growing an insulating layer over a single crystal silicon substrate, and then depositing polysilicon over the insulating layer. The third step is to dope the polysilicon uniformly with an n-type dopant at a concentration of up to about $10^{20}$ per cubic centimeter. The fourth step is to etch the poly lines as desired. Fifth, all of the circuits except the resistor area are masked, and then the resistor area is doped with a P-type dopant at a concentration greater than the concentration of the n-type dopant in the third step. Advantages of this method are that the P-type dopant enters the resistor area only and does not affect other circuit parameters. Concentrations can be high so that the thermal activation energy Ea can be reduced to as low as 0.1 electron volts. No extra mask is required. There are no evident disadvantages to this particular method.

As an example, when implanting sources and drains with arsenic, the resistor areas are masked. The same arsenic can be used in the present invention, thereby omitting the normal masking step of the resistor area at this time. Next, the non-resistor area can be masked, and the resistor area can be heavily doped with boron, a P-type substance. Thus, the net number of masking steps remains the same, but a far improved resistor obtains.

In conclusion, the present invention involves the fabrication of a device which operates as a resistor in polysilicon. Where the surrounding polysilicon is n-type, this new element is P-type, and vice versa. Where phosphorous is used as an n-type dopant, it is suspected that the phosphorous acts as a "getter" at the boundaries of the multiple polysilicon grains, and filters contaminants at that site. Phosphorous or arsenic can be added to the polysilicon middle which is also doped with boron, but the middle area should have a concentration of boron equal to or greater than the concentration of the "compensating" ion. The compensating ions, whether phosphorous or arsenic, are believed to segregate to the grain boundaries thereby leaving the boron ion dominant.

This structure results in a resistor which has the following advantages. First, at proper doping concentration, the resistance of these new resistors at test temperatures are in the range of from 0.1 to 59 gigaohms, which is an excellent range for VLSI static RAM load resistors. Second, the thermal activation energy at the required resistance range is in a range of about 0.1 to about 0.35 eV, which is below the range of 0.5 to about 0.6 eV for normal polysilicon resistors. The result is that static RAM cells with resistors according to the present invention can tolerate more leakage at cold temperatures without reducing the voltage at the cell node so much that the memory cell changes state, while still staying within maximum current limits at high temperatures.

Third, normal poly resistors are quite sensitive with respect to dopant concentration. They have been found to have a drop of 5.3 decades per decade in a plot of resistance versus dopant concentration at the applicable resistance range. In the present invention, however, the drop can be reduced to 0.2 decades per decade. This greatly reduces the sensitivity of the resistance value to doping concentration and assembly stress.

Fourth, the resistors according to the present invention are more heavily doped than similar valued standard polysilicon resistors. Because of this, they are less sensitive to unintentional doping from the doped low temperature oxide (LTO) over them. This permits more effective gettering in the LTO by using higher levels of phosphorous.

Fifth, resistors according to the present invention can be physically shorter than standard polysilicon resistors for the same processing temperature cycles.

Sixth, resistors according to the present invention can generally be substituted for prior art polysilicon resistors. In particular, they are suitable for use as load resistors in static RAMS.

Also, because of the low thermal activation energy of the resistors according to the present invention, room temperature resistance values below 1 gigaohm can be used in static RAM circuits. This reduces the sensitivity of the cell to alpha particles.

Although the invention has been described in terms of preferred and alternate embodiments, it will be apparent to those skilled in the art that many alterations and modifications may be made without departing from the invention. Accordingly, it is intended that all such alterations and modifications be considered as within the spirit and scope of the invention as defined by the appended claims.

What is claimed as the invention is:

1. A method of using a polysilicon structure as a resistance device in a semiconductor circuit comprising the steps of:

coupling a polysilicon structure in circuit with portions of an integrated circuit, applying a voltage across said polysilicon structure, and obtaining a current through said polysilicon structure proportional to said voltage, said polysilicon structure comprising a polysilicon region, a selected one of N-type and P-type impurities defining a middle area in said polysilicon region, the other one of said N-type and N-type impurities defining other areas located in said polysilicon region on the sides of said middle area, a PN junction being defined on one side of said middle area and an NP junction being defined at the other side of said middle area, the concentration of impurities in said middle area being greater than $10^{18}$ per cubic centimeter.

2. The method according to claim 1 wherein said side areas contain concentrations of impurities of between $10^{18}$ and $10^{21}$, and wherein said concentration of said middle area is lower than the concentration of impurities in said side areas.

3. The method according to claim 1 wherein said middle area is doped with boron and said side areas are doped with an N type impurity.

4. The method according to claim 1 wherein said middle area includes both an N type impurity and a P type impurity.

5. The method according to claim 4 wherein the concentration of said P type impurity in said middle area is equal to or greater than said concentration of said N type impurity in said middle area.

6. The method according to claim 1 wherein said middle area is doped with a P type impurity to a concentration greater than $10^{18}$ per cubic centimeter, said side regions are doped with an N type impurity to a concentration of between $10^{18}$ and $10^{20}$ per cubic centimeter, said middle area contacting said two side areas and defining an electrical path therethrough, the contact of said middle area to said two side areas forming a pair of junctions.

7. The method of claim 1 wherein said semiconductor circuit comprises a static RAM of the type having memory cells each including a flip-flop with load resistances, said polysilicon structure operating as a said load resistance, said method including operating said static RAM by storing data in a memory cell thereof, said step of applying a voltage comprising passing current through said polysilicon structure from a source of operating voltage to a node within said flip-flop.

8. The method according to claim 7 wherein said resistance is between about 0.1 and about 50 gigaohms when said voltage is five volts over a temperature range of about minus 55 degrees centigrade to plus 125 degrees centigrade.

9. A method of using polysilicon structures as a load resistance in a semiconductor static RAM of the type including plural memory cells each having a pair of cross-coupled transistors, each of said transistors having gate electrodes, comprising:

coupling a pair of polysilicon structures between said gate electrodes and a source of operating voltage, and storing data in said memory cells by causing said cross-coupled transistors to assume a state corresponding to said data, thereby obtaining currents through said polysilicon structures proportional to the voltages across them, said polysilicon structures operating as load resistors, each of said polysilicon structures comprising a polysilicon region, a selected one of N-type and P-type impurities defining a middle area in said polysilicon region, the other one of said N-type and P-type impurities defining other areas located in said polysilicon region on the sides of said middle area, a PN junction being defined on one side of said middle area and an NP junction being defined at the other side of said middle area, the concentration of impurities in said middle area being greater than $10^{18}$ per cubic centimeter.

10. The method according to claim 9 wherein said side areas contain concentrations of impurities of between $10^{18}$ and $10^{21}$, and wherein said concentration of said middle area is lower than the concentration of impurities in said side areas.

11. The method according to claim 10 wherein said middle area is doped with boron and said side areas are doped with an N type impurity.

12. The method according to claim 10 wherein said middle area includes both an N type impurity and a P type impurity.

13. The method according to claim 12 wherein the concentration of said P type impurity in said middle area is equal to or greater than said concentration of said N type impurity in said middle area.

14. The method according to claim 9 wherein said middle area is doped with a P type impurity to a concentration greater than $10^{18}$ per cubic centimeter, said side regions are doped with an N type impurity to a concentration of between $10^{18}$ and $10^{20}$ per cubic centimeter, said middle area contacting said two side areas and defining an electrical path therethrough, the contact of said middle area to said two side areas forming a pair of junctions.

15. The method according to claim 10 wherein said resistance is between about 0.1 and about 50 gigaohms when said voltage is five volts over a temperature range of about minus 55 degrees centigrade to plus 125 degrees centigrade.

* * * * *